US007015834B2

(12) United States Patent
Maeda

(10) Patent No.: US 7,015,834 B2
(45) Date of Patent: Mar. 21, 2006

(54) PUSHBUTTON INPUT DEVICE, REMOTE CONTROL EQUIPPED WITH PUSHBUTTON INPUT DEVICE, AND METHOD OF MANUFACTURING PUSHBUTTON UNIT USED FOR PUSHBUTTON INPUT DEVICE

(75) Inventor: Osamu Maeda, Daito (JP)

(73) Assignee: Funai Electric Co., Ltd., Daito (JP)

( * ) Notice: Subject to any disclaimer, the term of this patent is extended or adjusted under 35 U.S.C. 154(b) by 467 days.

(21) Appl. No.: 10/359,273

(22) Filed: Feb. 6, 2003

(65) Prior Publication Data

US 2003/0174084 A1 Sep. 18, 2003

(30) Foreign Application Priority Data

Feb. 7, 2002 (JP) ................................ 2002-31128
Feb. 8, 2002 (JP) ................................ 2002-562

(51) Int. Cl.
*H03M 11/00* (2006.01)

(52) U.S. Cl. ....................... 341/20; D14/247; 200/5 A; 200/512; 345/171

(58) Field of Classification Search .................. 341/20, 341/22, 173, 176; 361/680; 345/168, 171; 200/5 A, 512, 513; D14/247

See application file for complete search history.

(56) References Cited

U.S. PATENT DOCUMENTS 6,809,660 B1 * 10/2004 Bestle ......................... 341/20

FOREIGN PATENT DOCUMENTS

JP 60-141030 9/1985
JP 04-366514 12/1992

* cited by examiner

*Primary Examiner*—Albert K. Wong
(74) *Attorney, Agent, or Firm*—Crowell & Moring LLP

(57) ABSTRACT

A remote control is equipped with a pushbutton unit including a plurality of transverse linking sections linking pushbuttons in a transverse direction and a bridge section connecting the transverse linking sections at one side. This pushbutton unit is provided by integrally forming a first button group and a second button group respectively including a plurality of pushbuttons in a specified arrangement as a unit on a sheet-form elastic member in such a manner that pushbuttons of one button group are located between pushbuttons of the other button group and by cutting, along a specified cut line, this unit into two pushbutton units including transverse linking sections with pushbuttons linked in the transverse direction and a bridge section that connects the transverse linking sections at one side. Since the portion where any pushbutton of one pushbutton unit is not arranged can be used as the portion where a pushbutton of the other pushbutton unit is arranged in such a configuration, the wasteful use of material can be reduced. In addition, since two pushbutton units can be formed by one molding process, the forming man-hour per pushbutton unit can be reduced.

7 Claims, 7 Drawing Sheets

PUSHBUTTON INPUT DEVICE, REMOTE CONTROL EQUIPPED WITH PUSHBUTTON INPUT DEVICE, AND METHOD OF MANUFACTURING PUSHBUTTON UNIT USED FOR PUSHBUTTON INPUT DEVICE

BACKGROUND OF THE INVENTION

1. Field of the Invention

The present invention relates to a pushbutton input device with a plurality of pushbuttons arranged for entering commands, characters, and other entries as well as transmitting radio signals in response to a depressing operation of the pushbuttons, a remote control equipped with the pushbutton input device, and a method of manufacturing a pushbutton unit for use in the pushbutton input device.

2. Description of the Related Art

Conventionally, there exists a pushbutton input device that has a plurality of pushbuttons arranged and that enters commands, characters, etc. and transmits radio signals in response to a depressing operation of the pushbuttons in remote controls for remotely controlling TVs, videos, air conditioners, etc. or cellular phones, electric calculators, etc.

Such a pushbutton input device has a rubber button 30 which is a pushbutton unit as shown in FIG. 8 equipped inside a case. Rubber button 30 has a construction with a plurality of pushbuttons 31 arranged in a form of matrix on one flexible sheet section 32 and formed integrally. In addition, on the back side of each pushbutton 31, conductive material is applied.

Rubber button 30 is mounted inside a case with openings that correspond to the arrangement of pushbuttons 31 and with pushbuttons 31 exposed from the openings. In addition, there is equipped inside the case a circuit board with electric contact pairs formed, each pair of which come in contact with the conductive material applied on the backside of pushbutton 31 when pushbutton 31 is depressed and achieve electrical conduction.

In a conventional pushbutton input device having such a construction, pressing pushbuttons 31 electrically connects electric contact pairs on a circuit board, so that the device detects the depression of pushbuttons 31 for input of commands, characters, etc. and for transmission of radio signals in response to the depression.

In the meantime, a rubber sheet is known which permits unit sheets to be manufactured using the same mold, even when the size of unit sheets or the number of key tops may differ (for example, see Japanese Patent Laid-open Publication No. HEI 4-366514).

However, because in rubber button 30 of the conventional pushbutton input device described above, sheet section 32 encompasses the excess area between arrangements of pushbuttons 31, rubber material was used wastefully. In addition, since one rubber button 30 was formed with one piece of sheet section 32, in forming a plurality of rubber buttons 30, marking printing must be provided on the surface of pushbutton 31 and electrically conductive material must be applied to the backside of pushbuttons 31 for every rubber button 30. Even if the contents described in Japanese Patent Laid-open Publication No. HEI 4-366514 are applied, the above mentioned problems are unable to be solved.

SUMMARY OF THE INVENTION

The present invention is made for solving the problems, and it is an object of the present invention to provide a pushbutton input device, a remote control equipped with the pushbutton input device, and a method of manufacturing a pushbutton unit used for the pushbutton input device which permits a reduction in the production cost by eliminating or reducing wasteful use of rubber material while reducing the man-hour for marking printing to the surface of pushbutton section as well as the man-hour for applying contact conductive material to the backside of pushbutton section.

An aspect of the present invention provides a pushbutton input device with a plurality of pushbuttons arranged in a form of matrix for entering commands and characters by a depression of the pushbuttons, comprising: a pushbutton unit configured by a plurality of transverse linking sections linking the pushbuttons in a transverse direction and a bridge section connecting the transverse linking sections at one side, the transverse linking sections and the bridge section being formed integrally by cutting a sheet-form elastic member along a specified cut line; a circuit board provided with electric switches which achieve electrical conduction when the pushbuttons of the pushbutton unit are depressed; and a case having a plurality of openings that correspond to the plurality of pushbuttons of the pushbutton unit, the case housing the pushbutton unit and the circuit board with the pushbuttons exposed from the openings.

According to the present invention, the pushbutton unit has a construction in which unwanted portions with no pushbutton arranged are cut away. This can reduce the wasteful use of material for such unwanted portions, thus permitting the cost reduction.

Another aspect of the present invention provides a remote control having a pushbutton input device with a plurality of pushbuttons arranged in a form of matrix for entering commands and characters by a depression of the pushbuttons and a signal transmitting section for transmitting by radio corresponding signals to an apparatus to be controlled in response to the entries of commands and characters by the pushbutton input device so that the apparatus is remotely controlled in accordance with the entries, comprising: a pushbutton unit configured by a plurality of transverse linking sections linking the pushbuttons in a transverse direction and a bridge section connecting the transverse linking sections at one side, the transverse linking sections and the bridge section being formed integrally by cutting a sheet-form elastic member along a specified cut line; a circuit board provided with electric switches which achieve electrical conduction when the pushbuttons of the pushbutton unit are depressed; and a case having a plurality of openings that correspond to the plurality of pushbuttons of the pushbutton unit, the case housing the pushbutton unit and the circuit board with the pushbuttons exposed from the openings.

According to the present invention, the operations and effects same as above can be obtained.

A further aspect of the present invention provides a method of manufacturing a pushbutton unit with a plurality of pushbuttons arranged in a form of matrix, comprising the steps of: forming a first button group and a second button group, each of which includes a plurality of pushbuttons in a specified arrangement, as a unit on a sheet-form elastic member so that pushbuttons of one of the button groups are located between pushbuttons of the other; and cutting up the unit into the first group and the second group along a specified cut line after the step of forming the button groups so as to provide two pushbutton units including respectively transverse linking sections with a plurality of pushbuttons linked in a transverse direction and a bridge section that connects the transverse linking sections at one side.

According to the present invention, two pushbutton units are integrally formed as one unit so that a pushbutton of one pushbutton unit is located between pushbuttons of the other pushbutton unit. And this unit is cut along the specified cut line into two pushbutton units. Therefore, since the portion where any pushbutton of one pushbutton unit is not arranged can be used as a portion where a pushbutton of the other pushbutton unit is arranged, the wasteful use of material can be reduced. In addition, since two pushbutton units can be formed by one forming process, the man-hour per one pushbutton unit can be reduced and the cost can be reduced.

DETAILED DESCRIPTION OF THE EMBODIMENTS

Figure 1:
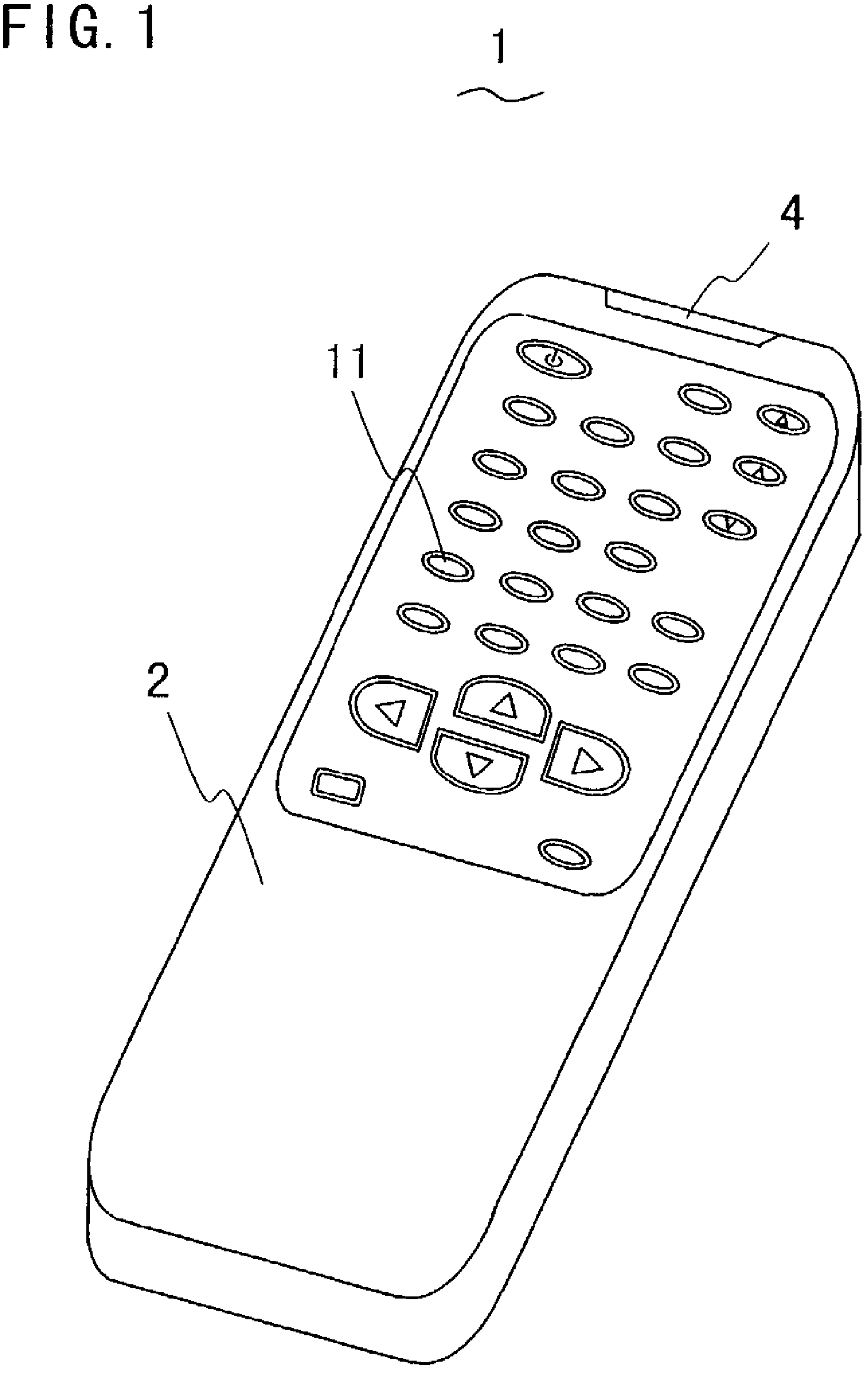
FIG. 1 is a perspective view showing a configuration of a remote control according to one embodiment of the present invention.

Referring to the drawings attached, preferred embodiments of the present invention will be described as follows. FIG. 1 shows a schematic configuration of a remote control which is a pushbutton input device according to one embodiment of the present invention. A remote control 1 has various pushbuttons 11 arranged in matrix at the surface side of a case 2 for remotely controlling actions of an apparatus to be controlled (not shown) and a transmitter section 4 located at the front section of case 2 for transmitting radio signals in response to a depressing operation of pushbutton 11.

Figure 2:
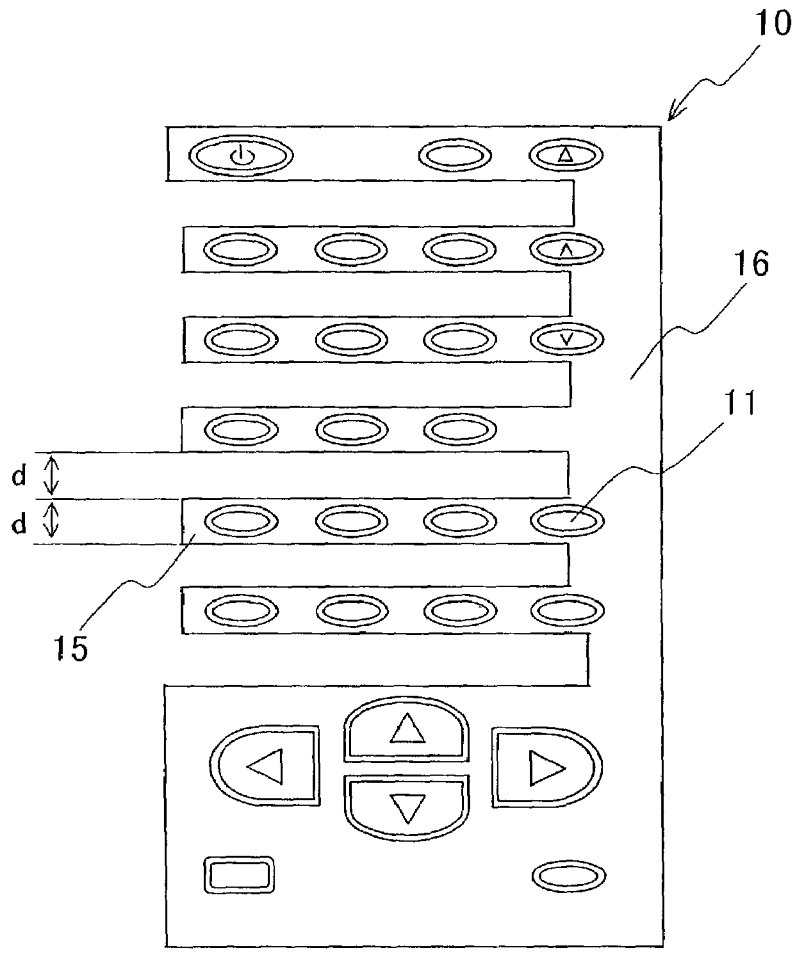
FIG. 2 is a plan view showing a configuration of a rubber button of the remote control.

Remote control 1 has a rubber button 10 equipped inside case 2, which is a pushbutton unit including a plurality of pushbuttons 11 arranged in the form of matrix as shown in FIG. 2. Rubber button 10 has a plurality of pushbuttons 11 integrally formed on a rubber material which is a sheet-form elastic member with resilience, and comprises a plurality of transverse linking sections 15 linking pushbuttons 11 in a transverse direction and a bridge section connecting the plurality of linking sections 15 at one side. Transverse linking sections 15 are connected by bridge section 16 at intervals of their own width size d.

Figure 3:
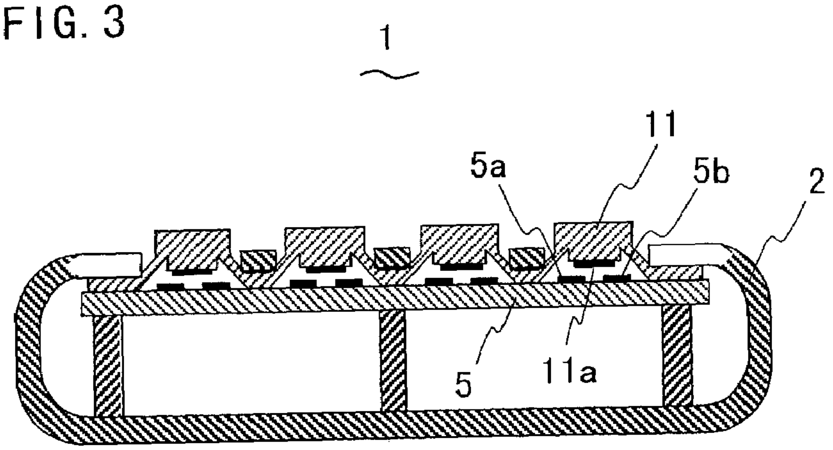
FIG. 3 is a cross-sectional view of the remote control.

Rubber button 10 is mounted to the inside of case 2 with each pushbutton 11 exposed from openings of case 2 as shown in FIG. 3. By this, each pushbutton 11 can be depressed from the outside of case 2. On the backside of each pushbutton 11, conductive material 11*a* composed of carbon is printed.

In addition, down below rubber button 10, a circuit board 5 is located. Circuit board 5 is provided with electric switch contact pairs 5*a*, 5*b* at the places that correspond to respective pushbuttons 11. Depressing pushbutton 11 causes conductive material 11*a* on the backside of pushbutton 11 to come in contact with electric switch contact pairs 5*a*, 5*b*, thus electric switch contact pairs 5*a*, 5*b* achieve electrical conduction.

In remote control 1 with such a configuration, depressing pushbutton 11 brings conductive material 11*a* on the backside in contact with electric switch contact pairs 5*a*, 5*b* of circuit board 5 so that electric switch contact pairs 5*a*, 5*b* achieve electrical conduction. Accordingly, the pushbutton inputs by depressing operation of pushbutton 11 are detected by a control circuit section (not illustrated), which creates signals of commands, characters, etc. that correspond to the pushbutton inputs and causes transmitter section 4 to transmit the signals in the form of infrared ray signals or other radio signals.

Figure 4:
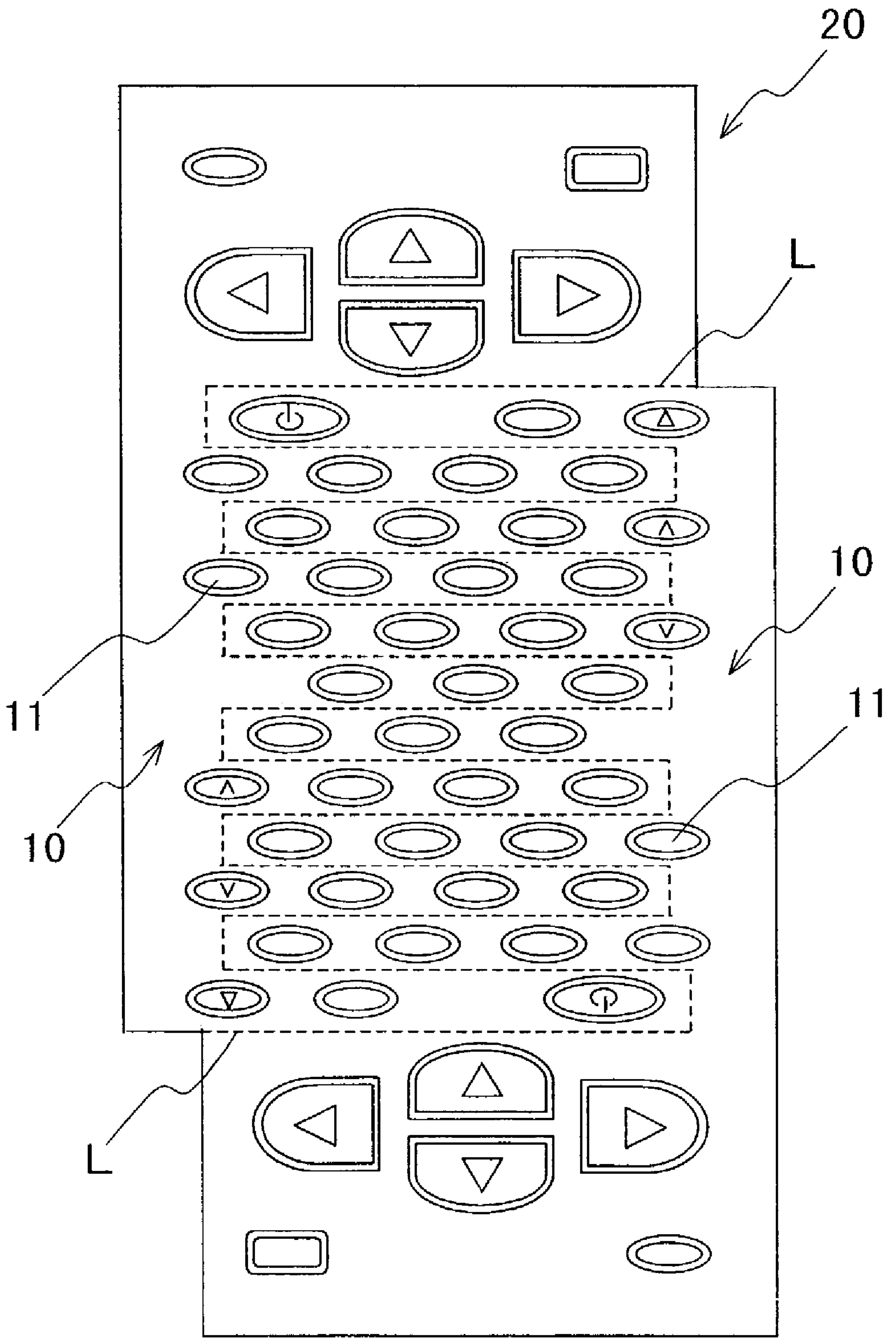
FIG. 4 is a plan view showing a configuration of a two-sheet compound unit fabricated in the manufacturing process of rubber buttons of the remote control.

Now, the manufacturing process of rubber button 10 will be described below. To manufacture rubber button 10, first of all, a two-sheet compound unit 20 made of elastic rubber material is formed as shown in FIG. 4. This two-sheet compound unit 20 has a plurality of pushbuttons 11 composing two rubber buttons 10 integrally formed as one unit so that it can be cut up along cut line L shown in a chained line in the figure. Pushbuttons 11 composing two rubber buttons 10 are formed in such a manner that pushbuttons of one rubber button 10 are located alternately between those of the other rubber button 10, and that arrangements of pushbuttons 11 become same with these arrangements rotated 180° mutually.

This two-sheet compound unit 20 is formed by pouring and curing molten rubber material in molds. In such event, on specified pushbuttons 11, marking composed of irregularities is formed by molds. For the rubber material, materials such as rubber, resin, etc. with resilience under the hardened condition are used.

Figure 5:
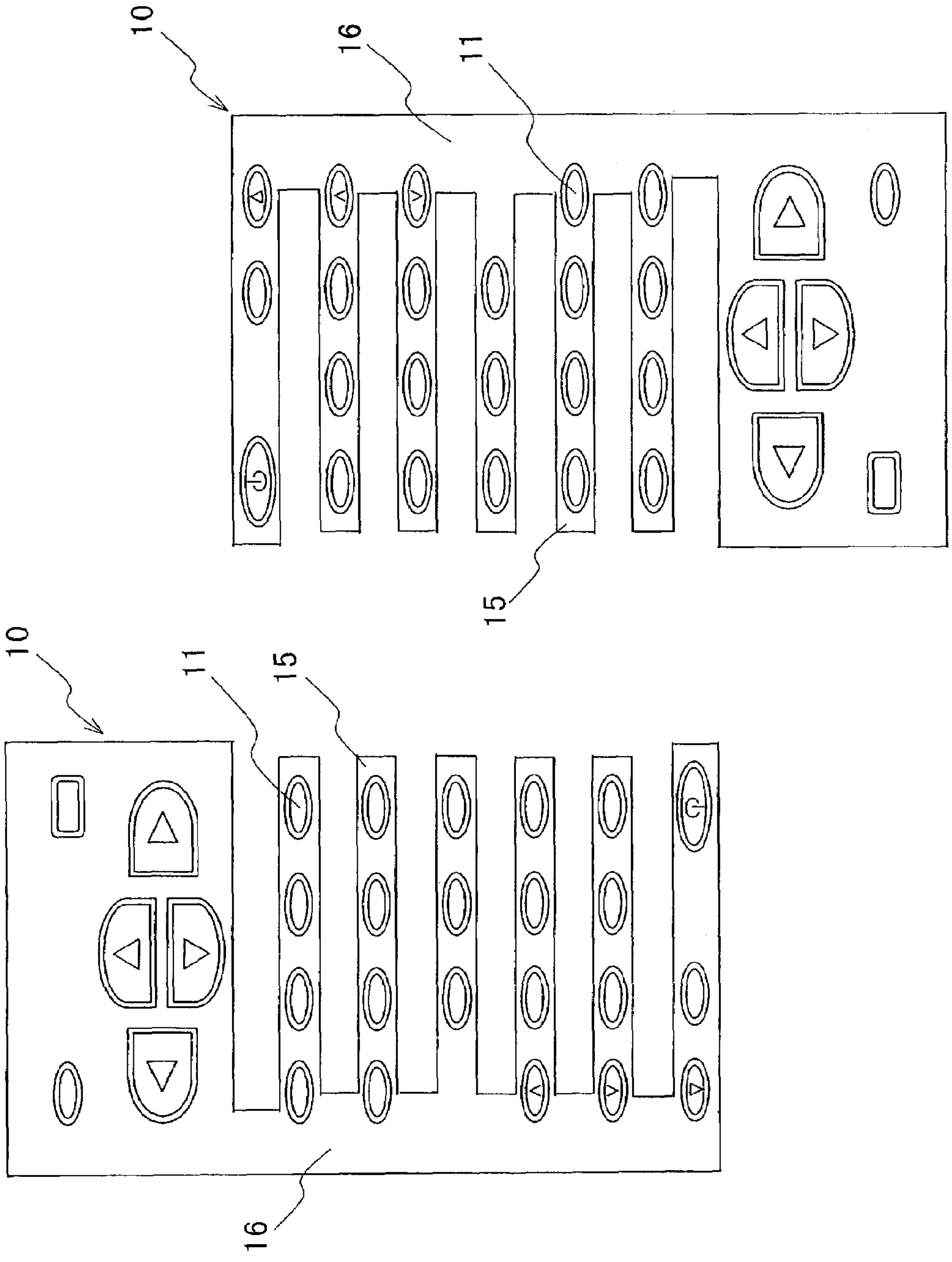
FIG. 5 is a plan view showing the state in which the two-sheet compound unit is cut up into two rubber buttons.

Then, on the surface side of pushbutton 11 of this kind of two-sheet compound unit 20, various kinds of marking such as characters, symbols, etc. are printed, and conductive material 11*a* including carbon, etc. is printed on the backside of pushbutton 11. And thereafter, by cutting up two-sheet compound unit 20 along cut line L, two rubber buttons 10 are formed as shown in FIG. 5. Each of two rubber buttons 10 cut up comprises a plurality of transverse linking sections 15 with pushbuttons 11 linked in a transverse direction and bridge section 16 connecting the linking sections 15 at one side. In addition, these two rubber buttons 10 have the same arrangement of pushbutton section 11, that is, they are identical. Illustrations of marking printed on the surface side of pushbutton 11 are omitted.

Because according to the above mentioned manufacturing process, the portion with no pushbutton 11 arranged in one rubber button 10 serves as a linking section 15 of the other rubber button 10, the wasteful use of rubber material for the unwanted portion can be reduced. In addition, since two rubber buttons 10 are formed in one molding process, the molding man-hour per one rubber button 10 can be reduced. Marking printing man-hour and conductive material printing man-hour per one rubber button 10 can be also reduced since printing is provided to two rubber buttons 10 in one printing process.

Figure 6:
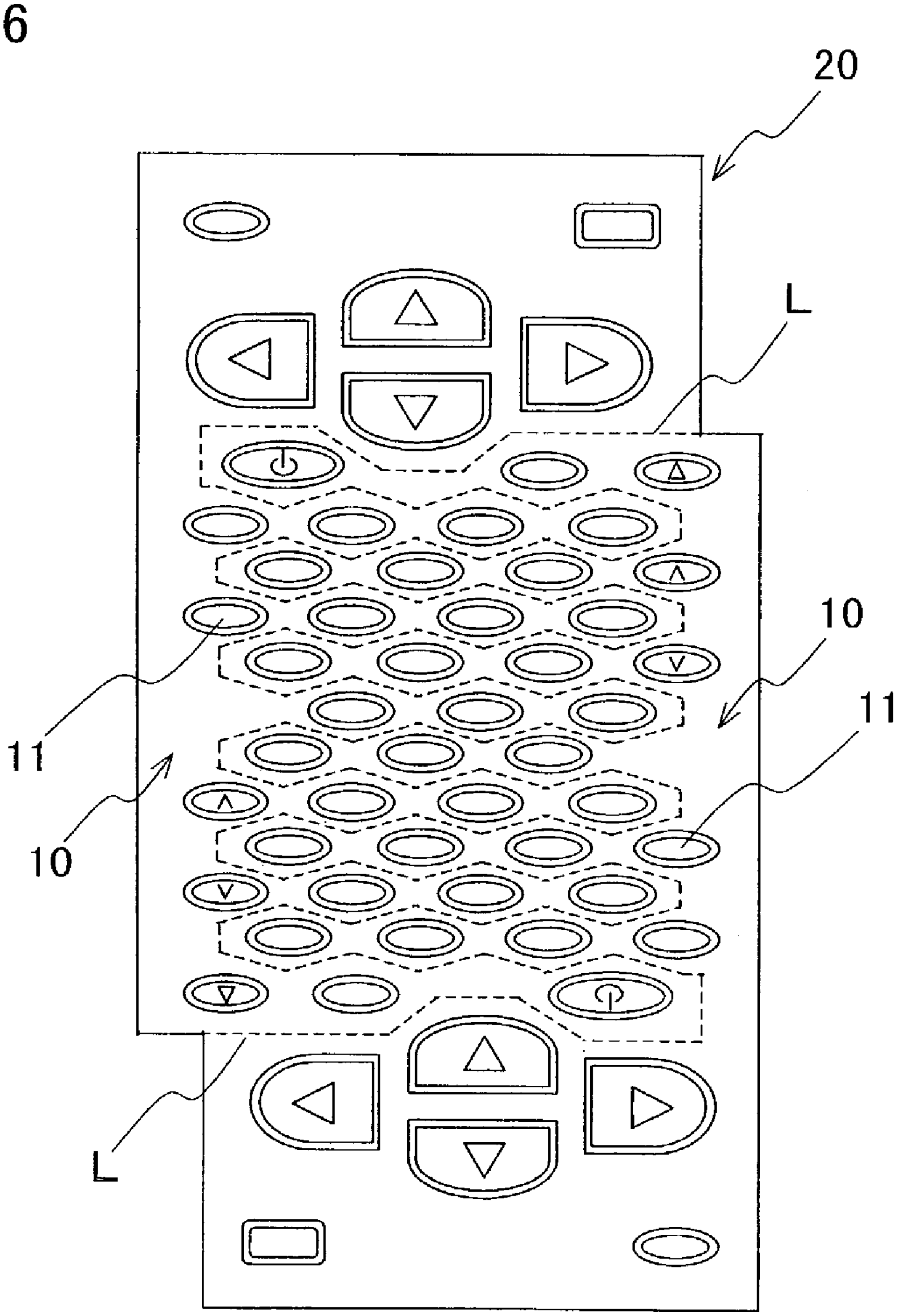
FIG. 6 is a plan view showing a cut-up example of the two-sheet compound unit according to another embodiment of the present invention.
Figure 7:
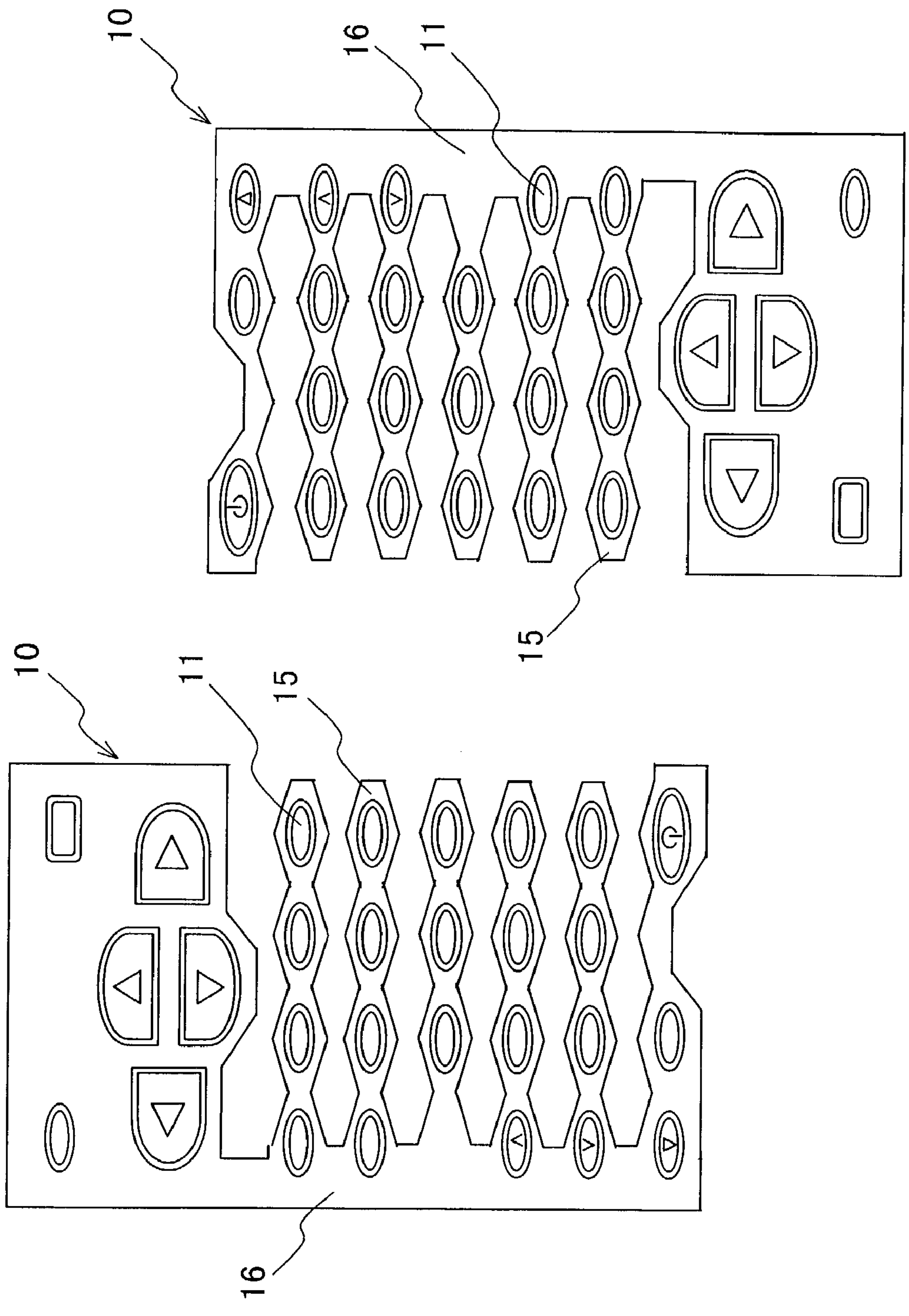
FIG. 7 is a plan view showing the state in which the two-sheet compound unit is cut up into two rubber buttons.
Figure 8:
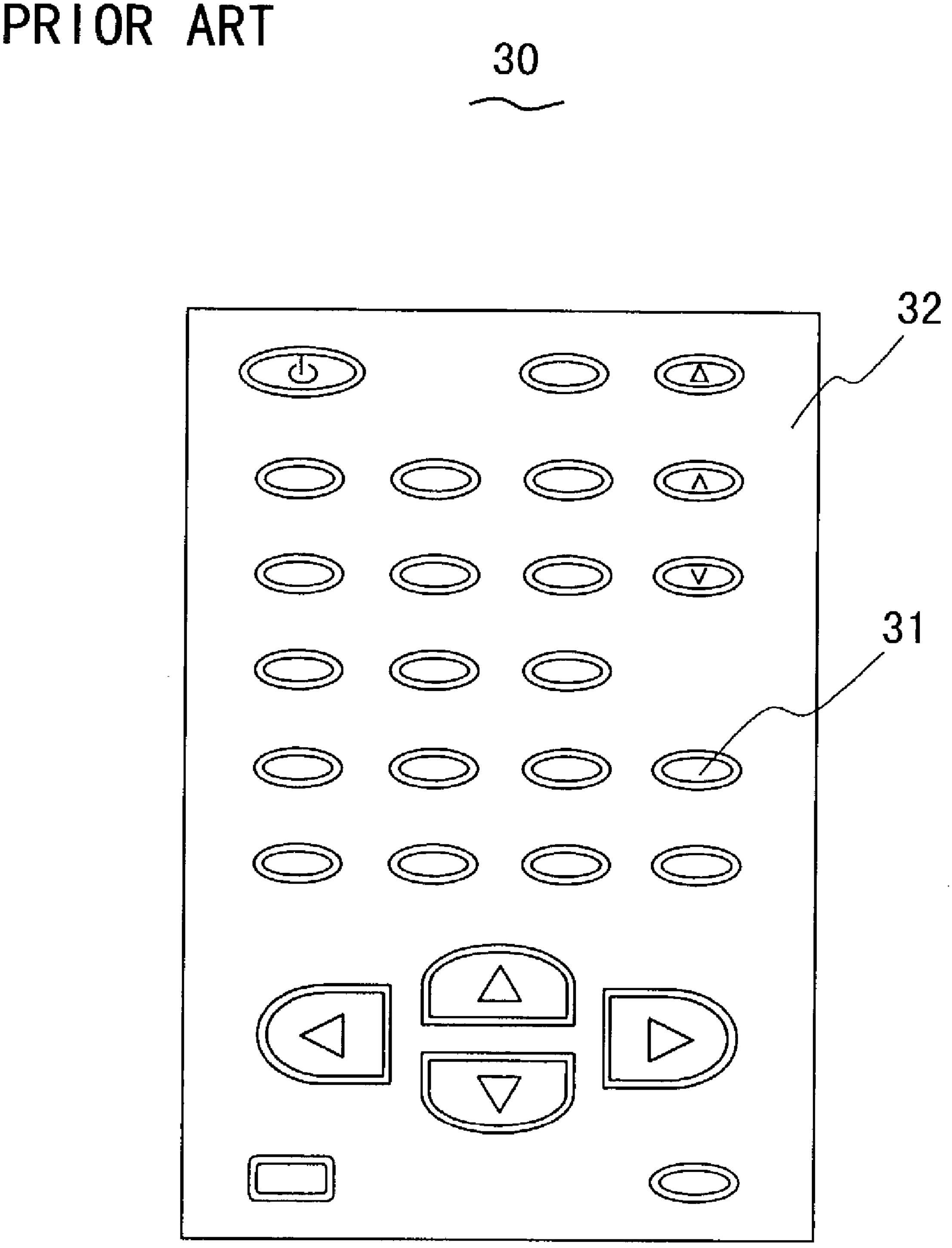
FIG. 8 PRIOR ART
FIG. 8 is a plan view showing a configuration of a conventional rubber button.

Now, another embodiment of the present invention will be described. In this embodiment, two-sheet compound unit 20 is configured to be cut up into two rubber buttons 10 along wedge-form cut line L as shown in FIG. 6. Wedge-form cut line L increases its breadth in the vicinity of pushbuttons 11 and decreases its breadth between pushbuttons 11. Pushbuttons 11 of one rubber button 10 and those of the other are located alternately. Other configurations are same as those of the embodiment described above. Two-sheet compound unit 20 produces two identical rubber buttons 10 as shown in FIG. 7 by cutting up along wedge-form cut line L. Each of two rubber buttons 10 cut up has a wedge form with transverse linking sections 15 broader in the vicinity of pushbuttons 11 and narrower between pushbuttons 11.

According to this embodiment, by forming cut line L into a wedge form, the arrangement intervals of pushbuttons 11 in the vertical direction in FIG. 6 can be narrowed, whereby rubber button 10 and remote control 1 with rubber button 10 mounted can be downsized.

The present invention is not limited by the configurations of the above mentioned embodiments but various modifications are available. For example, in the embodiments, the conductive material on the backside of pushbutton 11 may be formed by other method than printing. In addition, marking printing on the surface side of pushbutton 11 may not always be carried out but marking may be printed on the surface of case 2.

In addition, the present invention can be applied not only to remote controls but also to any other pushbutton input devices where a plurality of pushbuttons are arranged and commands, characters, etc. are entered in response to depressing operations of pushbuttons, such as cellular phones, electric calculators, etc. The present application claims the priority on the basis of application for patent filed on Feb. 7, 2002 and application for utility model registration filed on Feb. 8, 2002. The entire contents of the applications shall be incorporated in this application by reference.

What is claimed is:

1. A method of manufacturing a pushbutton unit with a plurality of pushbuttons arranged in a form of matrix, comprising the steps of:

forming a first button group and a second button group, each of which includes a plurality of pushbuttons in a specified arrangement, as a unit on a sheet-form elastic member so that pushbuttons of one of the button groups are located between pushbuttons of the other; and cutting up the unit into the first group and the second group along a specified cut line after the step of forming the button groups so as to provide two pushbutton units including respectively transverse linking sections with a plurality of pushbuttons linked in transverse direction and a bridge section that connects the transverse linking sections at one side.

2. The method of manufacturing a pushbutton unit according to claim 1, wherein the unit is formed in such a manner that the pushbuttons of the two button groups are located alternately in the button group forming step.

3. The method of manufacturing a pushbutton unit according to claim 1, wherein the unit is formed in the button group forming step in such a manner that arrangements of pushbuttons of the two button groups become same with arrangements thereof rotated 180° mutually.

4. The method of manufacturing a pushbutton unit according to claim 1, wherein the two button groups are cut up along the specified cut line so that the transverse linking sections are located at intervals of their own width size in the button group cutting up step.

5. The method of manufacturing a pushbutton unit according to claim 1, wherein the two button groups are cut up along the specified cut line so that the transverse linking sections are formed in a wedge shape having broad width in the vicinity of pushbuttons and narrow width between pushbuttons in the button group cutting up step.

6. The method of manufacturing a pushbutton unit according to claim 1, further comprising a step of printing a conducive material on a backside of the pushbutton of the unit formed in the pushbutton group forming step before the button group cutting up step.

7. The method of manufacturing a pushbutton unit according to claim 1, further comprising a step of printing a specified marking including a symbol or a character on a surface side of the pushbutton of the unit formed in the pushbutton group forming step before the button group cutting up step.

* * * * *